(12) United States Patent
Velthuis et al.

(10) Patent No.: US 10,790,643 B2
(45) Date of Patent: Sep. 29, 2020

(54) MULTI-PHASE BUSBAR FOR CONDUCTING ELECTRIC ENERGY AND METHOD OF MANUFACTURING THE SAME

(71) Applicant: ABB Schweiz AG, Baden (CH)

(72) Inventors: Rudi Velthuis, Lauchringen (DE); Andrej Krivda, Wettingen (CH)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 16/443,905

(22) Filed: Jun. 18, 2019

(65) Prior Publication Data

US 2019/0305447 A1 Oct. 3, 2019

Related U.S. Application Data

(63) Continuation of application No. PCT/EP2017/083058, filed on Dec. 15, 2017.

(30) Foreign Application Priority Data

Dec. 19, 2016 (EP) ..................................... 16205013
Dec. 19, 2016 (EP) ..................................... 16205020
Dec. 19, 2016 (EP) ..................................... 16205023

(51) Int. Cl.
*H02B 1/21* (2006.01)
*B32B 15/08* (2006.01)
(Continued)

(52) U.S. Cl.
CPC .............. *H02B 1/21* (2013.01); *B32B 15/08* (2013.01); *B32B 15/20* (2013.01); *H01B 7/009* (2013.01);
(Continued)

(58) Field of Classification Search
CPC ........ H02B 1/21; H01B 7/007; H01B 7/0216; H01B 7/08
(Continued)

(56) References Cited

U.S. PATENT DOCUMENTS 3,162,500 A * 12/1964 Pittman ................ H01R 12/523
439/45
5,017,145 A * 5/1991 Kanai .................... H02B 1/207
29/850
(Continued)

FOREIGN PATENT DOCUMENTS

DE 102008037966 A1 2/2010
DE 102005015945 B4 7/2015
(Continued)

*Primary Examiner* — Alexander Gilman
(74) *Attorney, Agent, or Firm* — Leydig, Voit & Mayer, Ltd.

(57) ABSTRACT

A multi-phase busbar for conducting electric energy includes: an insulating base layer made of an insulating material; a first conducting layer made of a sheet metal arranged on and adhesively bonded to the base layer; a first connecting pin mounted to the first conducting layer which extends in a direction with respect to the first conducting layer; a first insulating layer arranged on and adhesively bonded to the first conducting layer; a second conducting layer made of a sheet metal arranged on and adhesively bonded to the first insulating layer, the second conducting layer including a second connecting pin which extends in a direction parallel to the first connecting pin; and a second insulating layer arranged on and adhesively bonded to the second conducting layer. The second conducting layer and the first and second insulating layer each include at least one pinhole through which the first connecting pin projects.

19 Claims, 3 Drawing Sheets

(51) Int. Cl.
| | |
|---|---|
| *B32B 15/20* | (2006.01) |
| *H01B 7/00* | (2006.01) |
| *H01B 7/02* | (2006.01) |
| *H01B 7/08* | (2006.01) |
| *H01B 13/06* | (2006.01) |
| *H01R 9/26* | (2006.01) |
| *H02B 1/20* | (2006.01) |
| *H05K 3/20* | (2006.01) |
| *H05K 1/02* | (2006.01) |
| *H02G 5/00* | (2006.01) |
| *H02B 1/056* | (2006.01) |
| *H05K 3/46* | (2006.01) |

(52) U.S. Cl.
CPC ......... *H01B 7/0216* (2013.01); *H01B 7/0225* (2013.01); *H01B 7/08* (2013.01); *H01B 13/06* (2013.01); *H01R 9/2675* (2013.01); *H02B 1/20* (2013.01); *H02G 5/005* (2013.01); *H05K 1/0256* (2013.01); *H05K 3/202* (2013.01); *B32B 2255/26* (2013.01); *B32B 2457/00* (2013.01); *H02B 1/056* (2013.01); *H05K 3/4641* (2013.01); *H05K 3/4647* (2013.01); *H05K 2201/0187* (2013.01); *H05K 2201/0191* (2013.01); *H05K 2201/10272* (2013.01)

(58) Field of Classification Search
USPC .......................................................... 439/213
See application file for complete search history.

(56) References Cited

U.S. PATENT DOCUMENTS

| | | | | |
|---|---|---|---|---|
| 8,500,473 | B2* | 8/2013 | Fujiwara | ................ H01R 24/58 439/213 |
| 9,011,167 | B2* | 4/2015 | Fujiwara | ................... H01B 5/02 439/121 |
| 2004/0069527 | A1* | 4/2004 | Vanhoutte | .............. H02G 5/005 174/149 B |
| 2005/0099693 | A1* | 5/2005 | Schofield | ................ B60R 1/088 359/604 |
| 2007/0218257 | A1* | 9/2007 | Ambo | .................. H01R 9/2466 428/209 |
| 2012/0077359 | A1* | 3/2012 | Yamamoto | ........... H05K 3/4046 439/78 |
| 2019/0123030 | A1* | 4/2019 | Mrad | .................. H01L 23/5386 |
| 2019/0305526 | A1* | 10/2019 | Velthuis | .................. H05K 3/202 |

FOREIGN PATENT DOCUMENTS

| | | |
|---|---|---|
| JP | S 5017798 U | 2/1975 |
| JP | H 04115716 U | 10/1992 |
| WO | WO 2016133861 A1 | 8/2016 |

* cited by examiner

MULTI-PHASE BUSBAR FOR CONDUCTING ELECTRIC ENERGY AND METHOD OF MANUFACTURING THE SAME

CROSS-REFERENCE TO PRIOR APPLICATION

This application is a continuation of International Patent Application No. PCT/EP2017/083058, filed on Dec. 15, 2017, which claims priority to European Patent Application Nos. EP 16205013.2, filed on Dec. 19, 2016, EP 16205020.7, filed on Dec. 19, 2016, and EP 16205023.1, filed on Dec. 19, 2016. The entire disclosure of the foregoing applications is hereby incorporated by reference herein.

FIELD

The invention is related to a multi-phase busbar for conducting electric energy and a method of manufacturing the same.

BACKGROUND

Multi-phase busbars are used in switchboards to conduct and distribute alternating electrical current to different electrical devices which are usually installed in switch gear cabinets. In order to provide for the possibility to conduct all three phases or even more phases of an alternating current in a single busbar, multi-phase busbars have been developed which comprise a base layer and a cover layer of electrically insulating material between which two or more layers of conducting sheet metal, in particular copper, are arranged that are electrically insulated from each other by means of insulating intermediate layers.

An afore-described busbar in which the different layers are laminated to each other by means of liquid resin is described in DE 10 2005 015 945 84 of the applicant. The laminated busbar has the advantage that it is compact and does not tend to delaminate due to repellant forces which are generated by the alternating electric currents that are conducted in the different conducting layers for each phase and which in case of a short circuit can be in the range of several thousand ampere (kA).

One problem of the busbars as described in DE 10 2005 015 945 84 are the costs involved in the lamination process itself in which the different layers are bond to each other by means of a liquid resin, like epoxy resin, which is applied to the upper and lower side of each layer and cured afterwards. As the laminating resins used for the laminating process are usually toxic and are said to cause allergic reactions, specific safety precautions for the staff are required in the production process which significantly raise the production costs.

Another problem which arises is that the conducting layers must be carefully electrically insulated in order to prevent flashovers or sparkovers between the different conducting layers and the connecting pins. This means that a sufficient electrical insulation must be provided in the areas of high electric field intensities as they usually occur in the areas of the cut out or punched openings in the conducting layers through which the connecting pins extend. In the busbars of DE 10 2005 015 945 84, this additional electrical insulation is provided by cast resin which is filled into the openings through which the connecting pins project.

SUMMARY

In an embodiment, the present invention provides a multi-phase busbar for conducting electric energy, comprising: an insulating base layer comprising an insulating material; a first conducting layer comprising a sheet metal which is arranged on and adhesively bonded to the base layer; a first connecting pin mounted to the first conducting layer which extends in a direction with respect to the first conducting layer; a first insulating layer arranged on and adhesively bonded to the first conducting layer; a second conducting layer comprising a sheet metal which is arranged on and adhesively bonded to the first insulating layer, the second conducting layer comprising a second connecting pin which extends in a direction parallel to the first connecting pin; and a second insulating layer arranged on and adhesively bonded to the second conducting layer, wherein the second conducting layer and the first and second insulating layer each comprise at least one pinhole through which the first connecting pin projects, and wherein the first connecting pin is covered by a sleeve or cover of an insulating material which is arranged thereon and which projects from the first conducting layer through the pinholes formed in the second conducting layer and the insulating layers.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
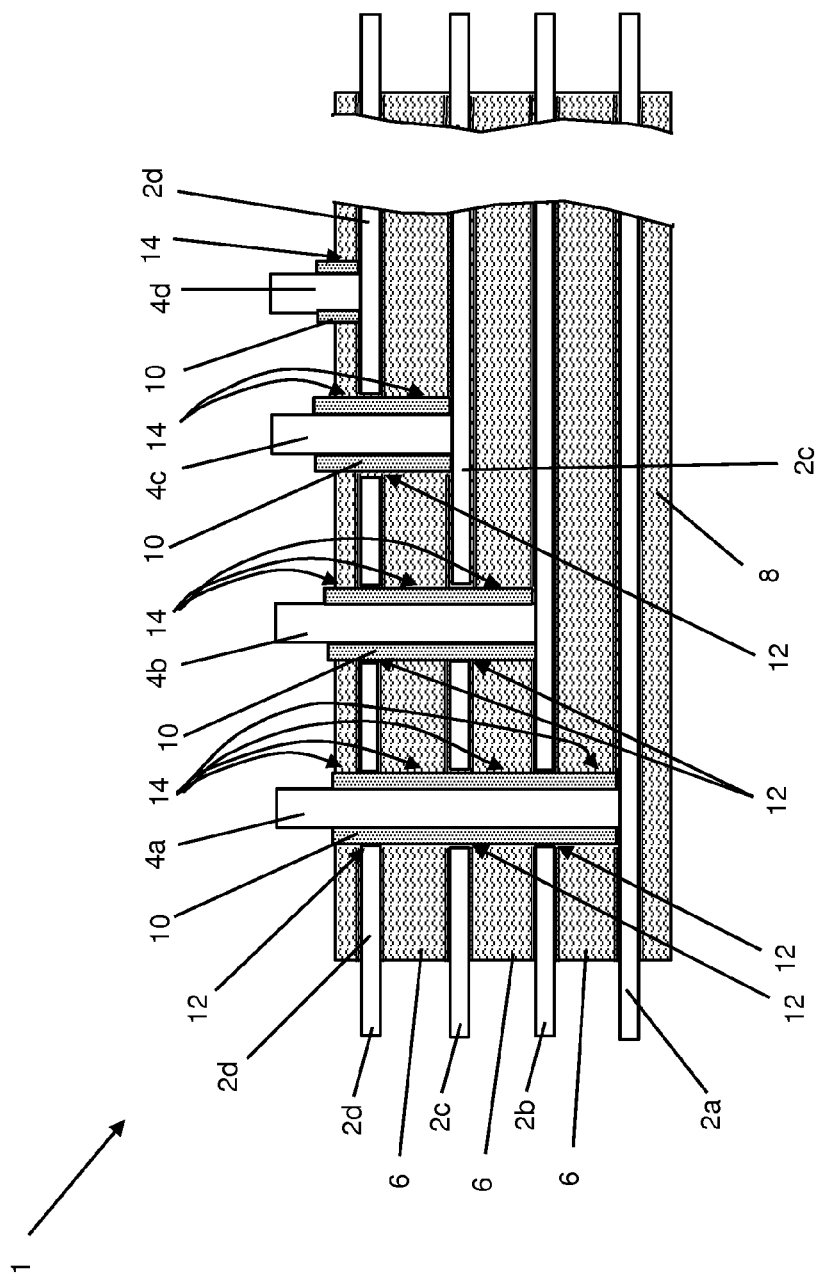
FIG. 1 is a schematic partial cross sectional view of a 4-phase busbar according to a first basic embodiment of the invention in which sleeves of substantially the same diameter are mounted on all four connecting pins of a set of connecting pins.

Accordingly, in an embodiment, the present invention provides a multi-phase busbar which can be manufactured at reduced costs and in a shorter time without the extensive application of electrical insulation coating to each layer for bonding the layers to each other and which also provides for an improved electrical insulation of the connecting pins against the conducting layers.

The invention has the advantage, that insulation, in particular air and solid insulation with a relatively low dielectric performance is used at locations with a low electric field, whereas an insulating material, in particular a solid insulation with a relatively high dielectrical performance, is solely used at locations with a high electric field. A further advantage of the invention is that the sleeves or covers of insulating material which are mounted to the connecting pins can be made of any known insulating material, e.g. from an insulating plastics material like a thermoplastic or thermoset resin or the like. Accordingly, the sleeves can be obtained as prefabricated components which are produced e.g. by injection molding. This further leads to a reduction of production costs and an increase in production flexibility.

According to the invention, a multi-phase busbar for conducting electric energy, comprises an insulating base layer made of an insulating material, a first conducting layer made of a sheet metal which is arranged on and adhesively bonded to said base layer, a first connecting pin mounted to the first conducting layer which extends in a direction preferably perpendicular to the first conducting layer, and a first insulating layer arranged on and adhesively bonded to the first conducting layer. A second conducting layer which is made of a sheet metal, preferably copper, is arranged on and adhesively bonded to the first insulating layer. The second conducting layer comprises a second connecting pin which extends in a direction parallel to the first connecting pin. A second insulating layer is arranged on and adhesively bonded to the second conducting layer. The second conducting layer and the first and second insulating layers each comprise at least one pinhole through which the first connecting pin projects. The multi-phase busbar which is preferably used in a known switch gear or switch gear cabinet, is wherein the first connecting pin is covered by a sleeve or cover which is made of an insulating material. The sleeve is arranged on the first and/or second connecting pin and projects from the first conducting layer through the pinholes which are formed in the second conducting layer and first and second insulating layers. The sleeve preferably extends up to a connecting end portion of the first or second connecting pin, to which the electrical devices in a switch gear or switch gear cabinet may be electrically connected.

In the preferred embodiment of the invention the sleeve is clamped to the outer surface of the first and/or second connecting pin and/or is affixed to the first connecting pin by means of an adhesive, which may be the same adhesive as it is used for adhesively connecting the different layers 2, 6 and 8 to each other, e.g. a fast curing resin or a contact adhesive or other type of glue which is able to mechanically permanently connect the different layers.

Alternatively, the insulating sleeve may be made of a shrinkable material like a thermoplastic resin which is shrunk to the first and/or second connecting pin by the application of heat, e.g. hot air, after positioning the sleeve/sleeves over the associated connecting pins.

Although in a minimum configuration, the busbar of the invention may have only two conducting layers for conducting two phases of an alternating current, the preferred embodiment of the busbar employs at least four conducting layers in total, for conducting and distributing the three phase and protective earth of an alternating current. To do so, a third conducting layer and a third insulating layer as well as a fourth conducting layer and a fourth insulating layer are adhesively bonded to the second insulating layer. The third and fourth conducting layers and the third and fourth insulating layers each comprises a pinhole which is aligned with the pinholes in the second conducting layer and in the first and second insulating layers as described herein before. Through these pinholes the first and/or second connecting pin and the sleeve and preferably further sleeves which may be mounted thereon as described hereinafter may project.

According to a further embodiment of the invention, which provides for an improved electrical insulating due to an extended physical creeping distance between the sharp inner edges of the pinholes which are formed in two neighboring conducting layers, at least one of the insulating layers includes a first insulating sub layer which is arranged on an upper side of a conducting layer and a second insulating sub layer which is arranged on a lower side of a conducting layer. In order to provide for the afore-mentioned improved insulation properties, the first insulating sub layer comprises a first pinhole which has a diameter that is larger than the pinhole in the second conducting layer and preferably also in the other conducting layers of the busbar.

In the afore-described embodiment of the invention the sleeve may comprise a first collar of an insulating material which is received in the first pinhole of the first insulating sub layer. The first collar preferably tightly fits into the first pinhole, in order to provide for an improved alignment of the insulating layers and the first conducting layers or further conducting layers, but also allows the collar to be easily moved into the pinhole when sliding the sleeve with the collar onto the connecting pin.

In busbars in which no collar is used, the edge of the first pinholes or generally speaking openings which are formed in the insulating layers in the same way slidingly fit into the outer diameter of the sleeve, in order to provide for a precise alignment of the conducting layers and insulating layers relative to each other.

An even further improved electrical insulation against flashovers may be obtained if at least one of the insulating layers includes a second insulating sub layer which is arranged on a lower side of an associated conducting layer and is preferably bonded thereto by means of a known adhesive. In this embodiment, the second insulating sub layer comprises a second pinhole which has a diameter that is smaller than the diameter of the associated pinhole in the adjoining second conducting layer.

In busbars having two or more conducting layers which are separated from each other by insulating layers, at least one further sleeve may be mounted around the first sleeve. This further sleeve may project from the upper side of the second insulating sub layer of the first insulating layer along the first sleeve up to the non-insulated connecting area of the first conducting pin 4a and may comprise a first collar which has a diameter that is adapted to the diameter of the pinhole of the second conducting layer, so that the first collar may be received and tightly fits therein when the further sleeve is slid over the first sleeve. This provides for a precise alignment of the layers. In addition hereto the further sleeve may also comprise a second collar of an insulating material which is preferably integrally formed with the first collar and the sleeve and which is received in the afore-mentioned first pinhole of the first insulating sub layer.

In a preferred embodiment of the invention, the busbar may comprise a plurality of sets of four connecting pins, each of which is mechanically connected to an associated conducting layer of the busbar, as it is described in DE 10 2005 015 945 B4. In this embodiment, each connecting pin of the plurality of sets of connecting pins may be equipped with one or more insulating sleeves as they are described with reference to the different embodiments mentioned herein before.

According to another aspect of the present invention, a method of manufacturing a multi-phase busbar comprises the following method steps:
  providing an insulating base layer made of an insulating material,
  adhesively bonding a first conducting layer made of a sheet metal to the base layer, which first conducting layer comprises a first connecting pin that is mounted thereat and extends in a direction perpendicular to the first conducting layer,
  mounting an insulating sleeve on the first connecting pin,
  adhesively bonding a first insulating layer to the first conducting layer, wherein the first insulating layer comprises a pinhole through which the first connecting pin and the sleeve project, adhesively bonding a second conducting layer made of a sheet metal to the first insulating layer, wherein the second conducting layer comprises a second connecting pin which extends in a direction parallel to the first connecting pin and also comprises a pinhole through which the first connecting pin and the insulating sleeve project, adhesively bonding a second insulating layer to the second conducting layer, wherein the second insulating layer comprises at least one pinhole through which the second connecting pin and the sleeve mounted thereon project.

In the preferred embodiment of the method, a second sleeve may be mounted on the first sleeve and/or at least one further insulating sleeve may be mounted on the second connecting pin before or after adhesively bonding the second first insulating layer to the first conducting layer.

The method has the advantage that the manufacturing time can be significantly reduced and the manufacturing precision of the assembled busbar may be advantageously increased, due to the easy alignment of the layers by way of the insulating sleeves which are mounted on preferably all connecting pins of a busbar.

According to yet another object of the invention, the second insulating sleeve may comprise a first collar which has a diameter that is smaller than the diameter of the first pinhole and the first collar which tightly fits into the first pinhole of the second conducting layer may be inserted into the first pinhole when mounting/sliding the second sleeve onto the first sleeve which has been mounted on the associated connecting pin before.

In another embodiment of the invention a multi-phase busbar, comprising a base body composed of conducting layers and electrically insulating materials to electrically insulate said conducting layers from each other is provided, wherein at least one conducting layer comprises a connection area which is free of insulating materials and/or wherein the base body is formed like a wall and is flat.

Advantageously the base body is formed like a wall and is flat. Hereby the busbar can be used as a protection or cover of a cabinet or within a cabinet.

Further advantageously a section or cabinet, comprising a housing, whereas the housing comprises at least a rear side, comprises at least one multiphase busbar as described above which is arranged on the rear side of the section or cabinet and/or forms at least a part of a back wall of the housing.

In a further embodiment several multiphase busbars are arranged on the rear side of the section or cabinet and/or form at least a part of a back wall of the housing, whereas the laminated busbars are on top of each other and whereas each multiphase busbar is formed as a band. The multi-phase busbar system can be split in four rows of horizontal multi-phase busbars of the same size and cross section.

In another embodiment of the invention instead of or in addition of adhesively bonding the respective conducting layer to the electrically insulating layer and vice versa the layers, in particular the layers of the base body, are mechanically clamped together.

In a further embodiment at least one of the conducting layers is coated by an electrically insulating material, in particular covered with an epoxy coating.

Figure 2:
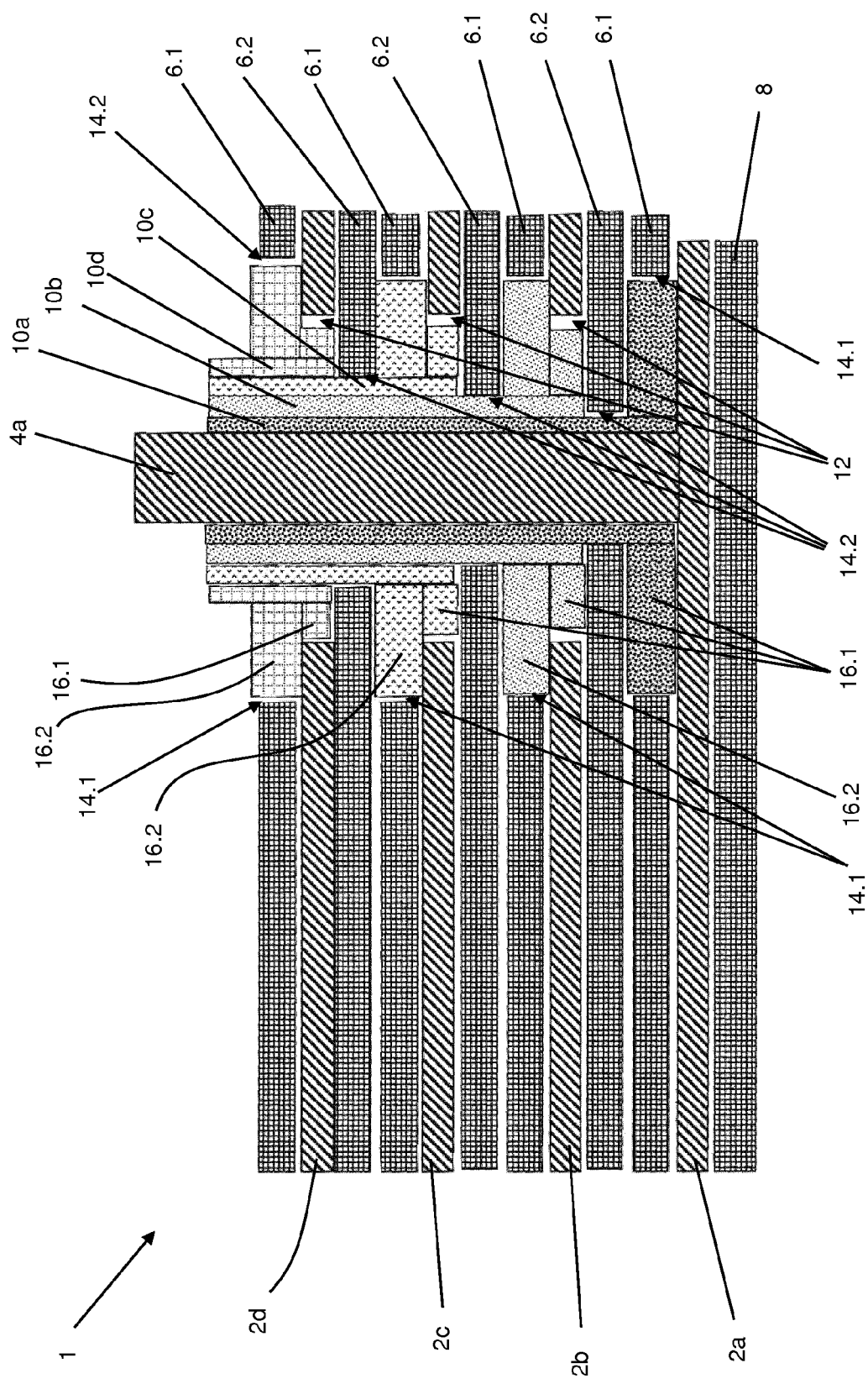
FIG. 2 is a schematic view of a more sophisticated exemplary embodiment of a busbar according to the invention in which four sleeves of different inner and outer diameters with collars formed thereat are arranged over an exemplary first connecting pin.
Figure 3:
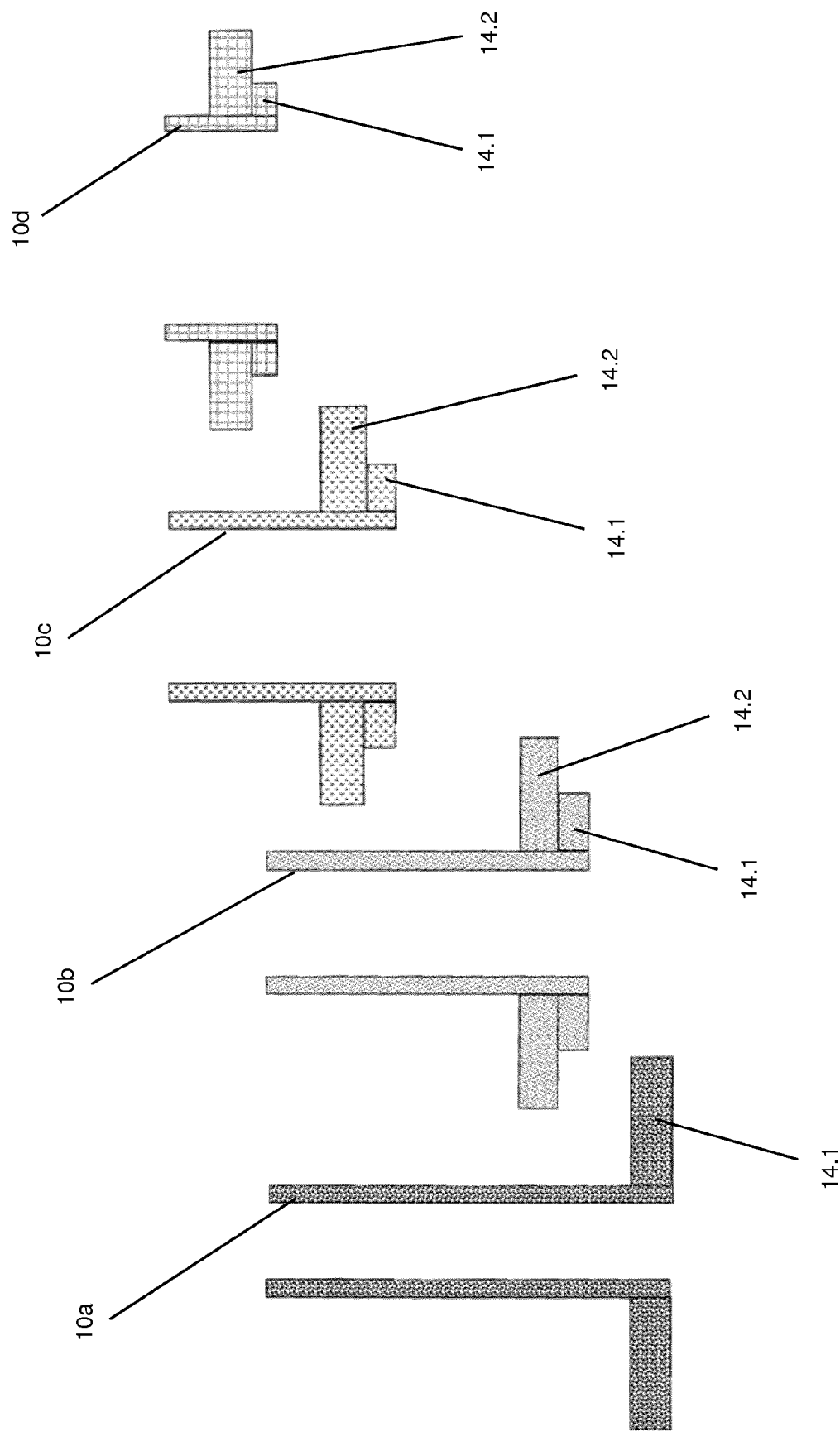
FIG. 3 is a schematic view of the four sleeves of FIG. 2.

As it is shown in FIGS. 1 to 3, a multi-phase busbar 1 for conducting electric energy comprises at least a first conducting layer 2a which is made of a sheet metal, preferably copper, which can have a thickness of 0.5 to 5 mm or even more or less. The first conducting layer 2a comprises at least one first connecting pin 4a which extends in a direction perpendicular to the first conducting layer 2a and which is either integrally formed with the conducting layer 2a when manufacturing the same or which is soldered or mechanically attached to the sheet metal by screwing or clamping.

As it can further be seen from FIGS. 1 and 2, the busbar 1 comprises a second conducting layer 2b which is preferably made of the same sheet metal as the first conducting layer 2a and which comprises a second connecting pin 4b mounted thereto.

In case of the busbar 1 shown in FIG. 1, which is designed for conducting three different phases and protective earth, of an electric alternating current two further conducting layers 2c and 2d are arranged above the first two conducting layers 2a, 2b.

As it is shown in FIGS. 1 and 2, the first conducting layer 2a is bonded to an insulating base layer 8 by means of an adhesive, and a first insulating layer 6 is arranged on and adhesively bonded to the first conducting layer 2a. The second conducting layer 2b is arranged on and adhesively bonded to the first insulating layer 6. A second insulating layer 6 is arranged on and adhesively bonded to the second conducting layer 2b. The second conducting layer 2b and the first and second insulating layers 6 each comprise at least one pinhole 12, 14 through which the first connecting pin 4a projects. The pinhole 12 in the conducting layers may be stamped out of the sheet metal, whereas the pinholes 14 in the insulating layers 6 which may be formed of a rigid insulating material like reinforced fiber glass or another fiber reinforced plastics material may e.g. be cut by punching, milling, waterjet cutting, lasing, drilling or applying/using other appropriate cutting devices into the insulating material. The insulating material may be a premanufactured plate shaped material having a thickness of 1 to 5 mm or more, depending of the electric voltage to be supplied by 1 5 the busbar 1.

The busbar 1 which is preferably used in a known switch gear or switch gear cabinet, is wherein at least the first connecting pin 4a is covered by at least one sleeve 10 which is made of an insulating material that is preferably the same material as the one of the insulating layers 6 and base layer 8, but may also be an extruded or injection-molded plastics material.

As it can be seen with regard to the embodiment shown in FIG. 1, which shows a basic embodiment of busbar 1 that can be manufactured in a very simple and cost effective manner, the sleeve 10 is arranged on the first connecting pin 4a and projects from the first conducting layer 2a through pinholes 12, 14 which are formed in the second conducting layer 2b, the first and second insulating layers 6, the further conducting layers 2c, 2d and also in the further insulating layers 6 which are arranged there between and also on top of the uppermost fourth conducting layer 2d. The sleeves 10 extend from the associated conducting layer 2a to 2d up to a connecting end portion of an associated connecting pin 4a to 4d, to which the electrical devices in a switch gear or switch gear cabinet are electrically connected.

In the preferred embodiment of the invention the sleeve 10 is mechanically clamped to the outer surface of the first connecting pins 4a to 4d and/or is affixed to the connecting pins by means of an adhesive. In the same way, the insulating sleeves 10 may be made of a shrinkable material like a thermoplastic resin which is shrunk to the connecting pin 4a to 4d by the application of heat, e.g. hot air, after positioning a sleeve 10 over an associated connecting pin 4a to 4d.

According to a further embodiment of the invention, which is shown in FIG. 2 with regard to only one of the connecting pins 4a to 4c and which provides for an improved electrical insulation due to an extended physical creeping length between the sharp inner edges of the pinholes 12, 14, 14.1, 14.2 which are formed in two neighboring conducting layers, at least one of the insulating layers includes a first insulating sub layer 6.1 which is arranged on an upper side of a conducting layer 2b, 2c, 2d and a second insulating sub layer 6.2 which is arranged on a lower side of a conducting layer 2b, 2c, 2d. In order to provide for the afore-mentioned improved electrical insulation properties, the first insulating sub layer 6.1 comprises a first pinhole 14.1 which has a diameter that is larger than the pinhole 12 in the second conducting layer 2b. As it can be further seen from FIG. 2, the sleeve 10a which is mounted as an innermost sleeve on a connecting pin 4 may comprise a first collar 16.1 of an insulating material which is received in the first pinhole 14.1 of the first insulating sub layer 6.1. The first collar 16.1 fits into the first pinhole 12 of a conducting layer 2a to 2d, and provides for an improved alignment of the insulating layers and the first conducting layers or further conducting layers.

As it is further illustrated in FIG. 2, a second insulating sub layer 6.2 is arranged on the lower side of each conducting layer 2b, 2c, 2d and is bonded thereto and also to the first insulating sub layer 6.1 by means of a known adhesive. The second insulating sub layer 6.2 comprises a second pinhole 14.2 which has a diameter that is smaller than the diameter of the pinhole 12 in the second conducting layer 2b and further conducting layers 2c to 2d.

In busbars 1 as the one shown in FIG. 2 which have two or more conducting layers 2 that are separated from each other by several pairs of insulating sub layers 6.1, 6.2, further sleeves 10b, 10c and 10d may be mounted on the first sleeve 10a. These further sleeves 10b, 10c, 10d extend from the associated insulating sub layer 6.2 of the first insulating layer along the first sleeve 10a up to the non-insulated connecting area of the first conducting pin 4a. As can be seen from FIG. 2, each of the further sleeves 10b, 10c, 10d comprises a first collar 16.1 which is received in an associated pinhole 12 of the second, third and fourth conducting layer 2b to 2d and preferably also tightly fits therein.

In addition hereto preferably each the further sleeves 10b, 10c, 10d also comprises a second collar 16.2 of an insulating material which has a lager diameter than the first collar 16.1 and is received in the afore-mentioned first pinhole 14.1 which is formed in an associated first insulating sub layer 6.1 of and also tightly fits therein for a precise alignment. Due to the different diameters of the collars 16.1 ad 16.2, an overlap of the insulating material of the different layers is obtained which advantageously increases the creeping length between two conducting layers 2a to 2d, respectively.

In order to assemble a busbar 1 of the invention, a method with the following method steps may be used:

First, an insulating base layer 8 which is made of a rigid insulating material is arranged on an even surface. Then a first conducting copper layer 2a with at least a first connecting pin 4a is glued thereto with the connecting pin extending upwardly in a direction perpendicular to the first conducting layer 2a. As a next step, an insulating sleeve 10 is slid over the first connecting pin 4a and preferably affixed threat by means of glue or a friction lit.

Thereafter, the first insulating layer 6 is arranged above the first conducting layer 2a with its pinhole 14 being aligned with the first conducting pin 4a.

In a next step, the second conducting layer 2b is positioned over the first insulating layer 6 such that its pinhole 12 matches the first conducting pin 4a, and the layer glued to the upper side of the first insulating layers 6.

Afterwards, a further insulating sleeve 10 is mounted on the second conducting pin 4b of the second conducting layer 2b and a second insulating layer 6 is arranged above the second conducting layer 2b with the two pinholes 14 provided therein matching the two conducting pins 4a, 4b and sleeves 10 mounted thereon. The second insulating layer 6 is then glued to the upper side of the second conducting layer 2b.

In order to glue the layers 8, 2 and 6 to each other, an adhesive may be applied to the upper surfaces of the base layer 2 and/or the upper and/or lower surfaces of each conducting layer 2a to 2d and/or each insulating layer 6, e.g. by means of an applicator roller.

In the embodiment of the invention, in which each insulating layer comprises a first and a second insulating sub layer 6.1, 6.2 in which opening 14 1 and 14.2 are formed and in which further insulating sleeves 10b to 10d with collars 16.1 and 16.2 are mounted on a first sleeve 10a, the assembling sequence of the different layers 8, 2a to 2d and 6.1, 6.2 is similar to the one described herein before with the difference that before or after gluing the second conducting layer 2b to the upper side of the second insulating sublayer 6.2, the second sleeve 10b is slid over the first sleeve 10a (FIG. 2) and the opening 12 in the second conducting layer 2b is aligned with the first collar 16.1 of the second sleeve 10b. Afterwards, the further layers 6.1, 6.2 and further sleeves 10c and third and fourth conducting layers 2d and 2e are arranged and glued to each other in the same sequence, as it is shown in FIG. 2. The sleeves 10a to 10d are shown in FIG. 3 from which it becomes clear, that only the second, third and fourth sleeves 10b to 10d comprise a first and a second collar 16.1 and 16.2, whereas the first sleeve 10a used in the embodiment of FIG. 2 comprises only one collar 16.1 which is received in the first pinhole or opening 14.1 that is formed in the first insulating sub layer 6.1 of the first insulating layer which is arranged on the first conducting layer 2a.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LISTING OF REFERENCE NUMERALS 1 busbar
2a first conducting layer
2b second conducting layer
2c third conducting layer
2d fourth conducting layer
4a first conducting pin
4b second conduction pin
4c third conducting pin
4d fourth conducting pin
6 insulating layers
6.1 first insulating sub layer part of insulating layer
6.2 second insulating sub layer
8 insulating base layer
10 insulating sleeve
10a first insulating sleeve
10b second insulating sleeve
10c third insulating sleeve
10d fourth insulating sleeve
12 pinhole in conducting layers
14 pinhole in insulating layers
14.1 pinhole in first insulating sub layer
14.2 pinhole in second insulating sub layer
16.1 first collar of insulating sleeve
16.2 second collar of insulating sleeve

What is claimed is:

1. A multi-phase busbar for conducting electric energy, comprising:
   an insulating base layer comprising an insulating material;
   a first conducting layer comprising a sheet metal which is arranged on and adhesively bonded to the base layer;
   a first connecting pin mounted to the first conducting layer which extends in a direction with respect to the first conducting layer;
   a first insulating layer arranged on and adhesively bonded to the first conducting layer;
   a second conducting layer comprising a sheet metal which is arranged on and adhesively bonded to the first insulating layer, the second conducting layer comprising a second connecting pin which extends in a direction parallel to the first connecting pin; and
   a second insulating layer arranged on and adhesively bonded to the second conducting layer;
   wherein the second conducting layer and the first and second insulating layer each comprise at least one pinhole through which the first connecting pin projects;
   wherein the first connecting pin is covered by a sleeve or cover of an insulating material which is arranged thereon and which projects from the first conducting layer through the pinholes formed in the second conducting layer and the insulating layers; and
   wherein at least one of the insulating layers includes a first insulating sub layer which is arranged on an upper side of a conducting layer and a second insulating sub layer which is arranged on a lower side of a conducting layer, the first insulating sub layer comprising a first pinhole having a diameter which is larger than the pinhole in the second conducting layer.

2. The multi-phase busbar according to claim 1, wherein the sleeve is clamped to the first connecting pin and/or is affixed to the first connecting pin by an adhesive, and/or wherein the insulating sleeve comprises a shrinkable material comprising a thermoplastic resin which is shrunk to the first connecting pin.

3. The multi-phase busbar according to claim 1, further comprising a third conducting layer and a third insulating layer and a fourth conducting layer and a fourth insulating layer adhesively bonded to the second insulating layer, the third and fourth conducting layers and the third and fourth insulating layers comprising pinholes through which the first connecting pin and the sleeve project.

4. The multi-phase busbar according to claim 1, wherein the sleeve comprises a first collar of insulating material which is received in the first pinhole of the first insulating sub layer.

5. The multi-phase busbar according to claim 1, wherein at least one of the insulating layers includes a second insulating sub layer which is arranged on a lower side of a conducting layer, the second insulating sub layer comprising a second pinhole having a diameter which is smaller than the diameter of the pinhole in the second conducting layer.

6. The multi-phase busbar according to claim 5, further comprising at least one further sleeve mounted on the sleeve, the further sleeve comprising a first collar which is received in the pinhole of the second conducting layer, and/or having a further collar of insulating material which is received in the first pinhole of a first insulating sub layer.

7. The multi-phase busbar according to claim 1, wherein at least one conducting layer is coated by an electrically insulating material comprising an epoxy coating covering.

8. A switchgear or switchgear cabinet, comprising:
   the multi-phase busbar according to claim 1.

9. The multi-phase busbar according to claim 1, wherein the direction in which the first conducting layer extends is perpendicular to the first conducting layer.

10. A method of manufacturing a multi-phase busbar for conducting electric energy, the multi-phase busbar comprising:
    an insulating base layer comprising an insulating material;
    a first conducting layer comprising a sheet metal which is arranged on and adhesively bonded to the base layer;
    a first connecting pin mounted to the first conducting layer which extends in a direction with respect to the first conducting layer;
    a first insulating layer arranged on and adhesively bonded to the first conducting layer;
    a second conducting layer comprising a sheet metal which is arranged on and adhesively bonded to the first insulating layer, the second conducting layer comprising a second connecting pin which extends in a direction parallel to the first connecting pin; and
    a second insulating layer arranged on and adhesively bonded to the second conducting layer;
    wherein the second conducting layer and the first and second insulating layer each comprise at least one pinhole through which the first connecting pin projects; and
    wherein the first connecting pin is covered by a sleeve or cover of an insulating material which is arranged thereon and which projects from the first conducting layer through the pinholes formed in the second conducting layer and the insulating layers;
    the method comprising the following method steps:
    providing an insulating base layer made of an insulating material;
    adhesively bonding a first conducting layer made of a sheet metal to the base layer, the first conducting layer comprising a first connecting pin mounted thereat which extends in a direction with respect to the first conducting layer;

mounting an insulating sleeve on the first connecting pin;

adhesively bonding a first insulating layer to the first conducting layer, the first insulating layer having a pinhole through which the first connecting pin and the sleeve project;

adhesively bonding a second conducting layer comprising a sheet metal to the first insulating layer, the second conducting layer comprising a second connecting pin which extends in a direction parallel to the first connecting pin and a pinhole through which the first connecting pin and the insulating sleeve project; and adhesively bonding a second insulating layer on the second conducting layer, the second insulating layer comprising at least one pinhole through which the second connecting pin and the sleeve mounted thereto project.

11. The method of claim 10, wherein after adhesively bonding the first insulating layer to the first conducting layer, a second sleeve is mounted on the first sleeve and/or a further insulating sleeve is mounted on the second connecting pin.

12. The method of claim 11, wherein the second sleeve comprises a first collar, the first collar having a diameter which is smaller than the diameter of the first pinhole, and
wherein the first collar is inserted into the first pinhole of the second conducting layer when mounting the second sleeve on the first connecting pin.

13. The method according to claim 10, wherein the direction in which the first connecting pin extends is perpendicular to the first conducting layer.

14. The multi-phase bus bar manufactured according to the method of claim 10.

15. The method of claim 10, wherein at least one of the insulating layers includes a first insulating sub layer which is arranged on an upper side of a conducting layer and a second insulating sub layer which is arranged on a lower side of a conducting layer, the first insulating sub layer comprising a first pinhole having a diameter which is larger than the pinhole in the second conducting layer.

16. A method of manufacturing a multi-phase busbar for conducting electric energy, the multi-phase busbar comprising:
an insulating base layer comprising an insulating material;
a first conducting layer comprising a sheet metal which is arranged on and adhesively bonded to the base layer;
a first connecting pin mounted to the first conducting layer which extends in a direction with respect to the first conducting layer;
a first insulating layer arranged on and adhesively bonded to the first conducting layer;
a second conducting layer comprising a sheet metal which is arranged on and adhesively bonded to the first insulating layer, the second conducting layer comprising a second connecting pin which extends in a direction parallel to the first connecting pin; and
a second insulating layer arranged on and adhesively bonded to the second conducting layer;
wherein the second conducting layer and the first and second insulating layer each comprise at least one pinhole through which the first connecting pin projects; and
wherein the first connecting pin is covered by a sleeve or cover of an insulating material which is arranged thereon and which projects from the first conducting layer through the pinholes formed in the second conducting layer and the insulating layers;

the method comprising the following method steps:
providing an insulating base layer comprising an insulating material;
placing a first conducting layer comprising a sheet metal to the base layer, the first conducting layer comprising a first connecting pin mounted thereat which extends in a direction perpendicular to the first conducting layer;
mounting an insulating sleeve on the first connecting pin;
placing a first insulating layer to the first conducting layer, the first insulating layer having a pinhole through which the first connecting pin and the sleeve project;
placing a second conducting layer comprising a sheet metal to the first insulating layer, the second conducting layer comprising a second connecting pin which extends in a direction parallel to the first connecting pin and a pinhole through which the first connecting pin and the insulating sleeve project;
placing a second insulating layer on the second conducting layer, the second insulating layer comprising at least one pinhole through which the second connecting pin and the sleeve mounted thereto; and
mechanically clamping together the insulating base layer and the second insulating layer.

17. The method of claim 16, wherein, after placing the first insulating layer to the first conducting layer, a second sleeve is mounted on the first sleeve and/or a further insulating sleeve is mounted on the second connecting pin.

18. The method of claim 17, wherein the second sleeve comprises a first collar, the first collar having a diameter which is smaller than the diameter of the first pinhole, and
wherein the first collar is inserted into the first pinhole of the second conducting layer when mounting the second sleeve on the first connecting pin.

19. The method of claim 16, wherein at least one of the insulating layers includes a first insulating sub layer which is arranged on an upper side of a conducting layer and a second insulating sub layer which is arranged on a lower side of a conducting layer, the first insulating sub layer comprising a first pinhole having a diameter which is larger than the pinhole in the second conducting layer.

\* \* \* \* \*